United States Patent

Hawkins

[15] 3,705,399

[45] Dec. 5, 1972

[54] DIGITAL TO ANALOG CONVERTER

[72] Inventor: William M. Hawkins, Hockessin, Del.

[73] Assignee: Hercules Incorporated, Wilmington, Del.

[22] Filed: Dec. 9, 1970

[21] Appl. No.: 96,440

[52] U.S. Cl.......340/347 DA, 235/92 CC, 235/92 GT

[51] Int. Cl...........................H03k 13/02, H03k 21/06

[58] Field of Search......340/347 DA, 168 SR, 146.2, 340/149 N; 235/92 CC, 92 GT; 328/51

[56] References Cited

UNITED STATES PATENTS

| | | | |
|---|---|---|---|
| 3,267,429 | 8/1966 | Strohmeyer | 340/347 DA |
| 3,422,423 | 1/1969 | Kaszynski et al. | 340/347 DA |
| 3,354,295 | 11/1967 | Kulka | 235/92 CC |
| 3,422,254 | 1/1969 | Lundin | 235/92 GT |
| 3,508,033 | 4/1970 | Turecki | 235/92 CC |

*Primary Examiner*—Thomas A. Robinson
*Attorney*—Finnegan, Henderson & Farabow

[57] ABSTRACT

A digital to analog converter is provided for converting a set of binary input signals into an analog signal having an amplitude determined by the binary input signals. The converter includes a binary counter comprising a plurality of groups of binary counting stages connected in series and operable in predetermined counting sequences. Circuit means are provided for synchronizing the operation of the groups of binary counting stages with a source of timing pulses. The converter also includes comparator means for comparing the set of binary input signals with the signals (binary counting states) produced by the binary counter and producing an output pulse when the signals are identical. An output circuit responsive to the comparator means is provided for producing an analog output signal having an amplitude determined by the time required for the binary counter to count from a predetermined set of binary counting states to the binary counting states that are identical to the binary input signals.

16 Claims, 5 Drawing Figures

INVENTOR
WILLIAM M. HAWKINS

Finnegan, Henderson & Farabow
ATTORNEYS

INVENTOR
WILLIAM M. HAWKINS

Finnegan, Henderson & Farabow
ATTORNEYS

INVENTOR
WILLIAM M. HAWKINS

Finnegan, Henderson & Farabow
ATTORNEYS

DIGITAL TO ANALOG CONVERTER

The present invention relates to a digital to analog converter, and more particularly, to a digital to analog converter for converting a set of binary input signals into an analog signal having an amplitude determined by the binary input signals.

In the prior art, digital to analog converters have utilized the combination of a binary counter, a comparator, and an output circuit for producing an output signal having an amplitude determined by a set of binary input signals applied to the comparator. In the operation of this type of digital to analog converter, the comparator compares the set of binary input signals to the binary counting states of the binary counter and produces an output signal when the binary counting states are identical to the set of binary input signals. The output signal of the comparator is applied to a bistable circuit element in the output circuit having first and second conducting states. This signal drives the bistable circuit element to one of its conducting states. When the binary counter arrives at a predetermined set of counting states, the bistable circuit element is driven to its opposite conducting state. Thus, the bistable circuit element produces an output signal having a duration proportional to the time required for the binary counter to count from the predetermined set of counting states to a set of counting states that is identical to the set of binary input signals. The output signal produced by the bistable circuit element is applied to a circuit for converting the output signal to a voltage level proportional to the duration of the output signal.

In the operation of these prior art digital to analog converters, the conversion speed of the converter has been limited by a characteristic of the binary counter known as "carry propagation delay." This carry propagation delay occurs because every binary counting stage operates with a small time delay, and the effect of the time delays on the operation of the binary counter is cumulative. For example, in a series of binary counting stages, the time delay of the first stage is passed onto the second binary counting stage which adds its own time delay to the time delay of the first stage. The combined time delays of the first and second stages are passed on to the third binary counting stage which adds its own time delay to the previously accumulated delay. This operation is repeated in all of the subsequent binary counting stages so that the last stage of the binary counter is operated with a time delay equal to the sum of the time delays of all of the binary stages.

The carry propagation delay results in the appearance of false output signals at the output of the comparator which occur because the counting states of the binary counting stages do not change simultaneously in response to the application of input pulses to the counter. Thus, after every input pulse applied to the binary counter, the comparator receives a changing set of binary counting states from the counter and is incapable of performing an accurate comparison with the set of binary input signals.

In accordance with the present invention, a digital to analog converter for converting a set of binary input signals into an analog output signal includes a binary counter comprising first and second groups of binary counting stages in which each group of binary counting stages is operable in a predetermined counting sequence. In addition, the converter includes means connected to the first group of binary counting stages for applying timing pulses to operate that group in its predetermined counting sequence. The converter also includes circuit means responsive to the first group of binary counting stages, and also responsive to the timing pulses. These circuit means connect the first and second groups of binary counting stages in series and produce output pulses synchronized with the timing pulses to operate the second group of binary counting stages in its predetermined counting sequence.

The digital to analog converter of this invention includes comparator means for comparing the set of binary input signals to the binary counting states of the first and second groups of binary counting stages. The comparator means produce an output signal when the binary counting states are identical to the set of binary input signals. Finally, an output circuit responsive to the signal produced by the comparator means is provided for producing an analog output signal having an amplitude determined by the time required for the first and second groups of binary counting stages to count from a predetermined set of binary counting states to binary counting states identical to the set of binary input signals.

In a preferred embodiment of the digital to analog converter, the binary counter comprises a plurality of groups of binary counting stages in which each group of binary counting stages is provided with an input for receiving pulses to operate that group in a predetermined counting sequence. The preferred embodiment includes means connected to the input of a first of the groups of binary counting stages for applying timing pulses to the input to operate the first group in its predetermined counting sequence. In addition, the preferred embodiment includes a plurality of gating circuits connected to the input of the other groups of binary counting stages and responsive to the timing pulses for connecting the groups of binary counting stages in series and synchronizing the groups with the timing pulses.

The preferred embodiment includes comparator means comprising a plurality of comparators corresponding to the groups of binary counting stages and responsive to selected groups of the binary input signals for comparing the selected groups of binary input signals to the binary counting states of the corresponding groups of binary counting stages. The comparators produce output signals when the binary counting states of the corresponding groups of binary counting stages are identical to the selected groups of binary input signals applied to the comparators. In addition, the digital to analog converter includes gating circuitry having a plurality of input terminals connected to the comparators, an input terminal responsive to the timing pulses, and an output terminal for producing an output signal synchronized with one of the timing pulses when the binary counting states of the groups of binary counting stages are identical to the set of binary input signals. This gating circuitry synchronizes the operation of the comparators with the timing pulses and prevents the comparators from producing false output signals.

In the preferred embodiment, an output circuit responsive to the signal produced by the comparator means is provided for producing an analog output signal having an amplitude determined by the time required for the groups of binary counting stages to count from a predetermined set of binary counting states to the binary counting states that are identical to the sets of binary input signals. The preferred embodiment includes pulse transformers for applying input signals to the output circuit to isolate digital circuit voltages in the binary counter and comparator means from analog circuit voltages in the output circuit.

The digital to analog converter of the present invention is designed to eliminate false signals at the output of the comparator by reducing the effect of carry propagation delay in the operation of the converter. The carry propagation delay is reduced by synchronizing a plurality of groups of binary counting stages in the binary counter with timing pulses applied to the counter. The groups of binary counting stages are arranged in series, and the synchronization of the groups to the timing pulses prevents carry propagation delay from being passed on from one group of binary counting stages to the next group. The operation of the groups of binary counting stages in synchronism with the timing pulses enables the comparator to function with a maximum carry propagation delay equal to the delay for one group of binary counting stages and to perform an accurate comparison of the binary counting states of the binary counter with the set of binary input signals. The decrease in the carry propagation delay of the binary counter enables the comparator to be operated at higher frequencies.

The accompanying drawings illustrate a preferred embodiment of the invention and, together with the description, serve to explain the principles of the invention.

Figure 1:
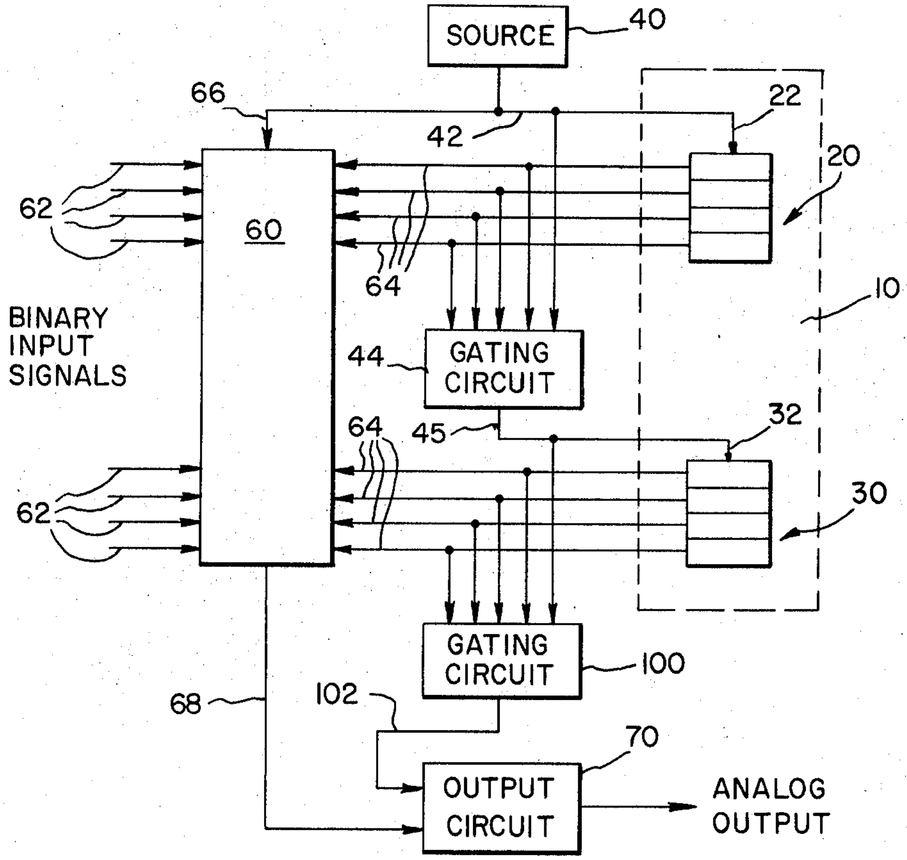
FIG. 1 is a block diagram illustrating a digital to analog converter constructed in accordance with the principles of this invention and including a binary counter comprising first and second groups of binary counting stages, circuit means for connecting the groups of binary counting stages in series, comparator means, and an output circuit.

Referring to FIG. 1, a digital to analog converter incorporating the principles of the present invention is shown. In accordance with the invention, the digital to analog converter includes a binary counter comprising first and second groups of binary counting stages in which each group is operable in a predetermined counting sequence. As embodied, a binary counter 10 (FIG. 1) of the digital to analog converter includes a first group 20 of binary counting stages and a second group 30 of binary counting stages. Both groups 20 and 30 include four bistable counting stages connected in series.

The first group of binary counting stages has an input terminal 22 for receiving timing pulses to operate the first group in its predetermined counting sequence. Similarly, the second group of binary counting stages has an input terminal 32 for receiving input pulses to operate the second group in its predetermined counting sequence. The binary counting stages of both groups 20 and 30 are interconnected to be operated in the following sequence: 0000, 1000, 0100, 1100, . . . , 1111. In addition, the binary counting stages of both groups are designed to be operated by binary "1" to "0" voltage transitions.

Figure 5:
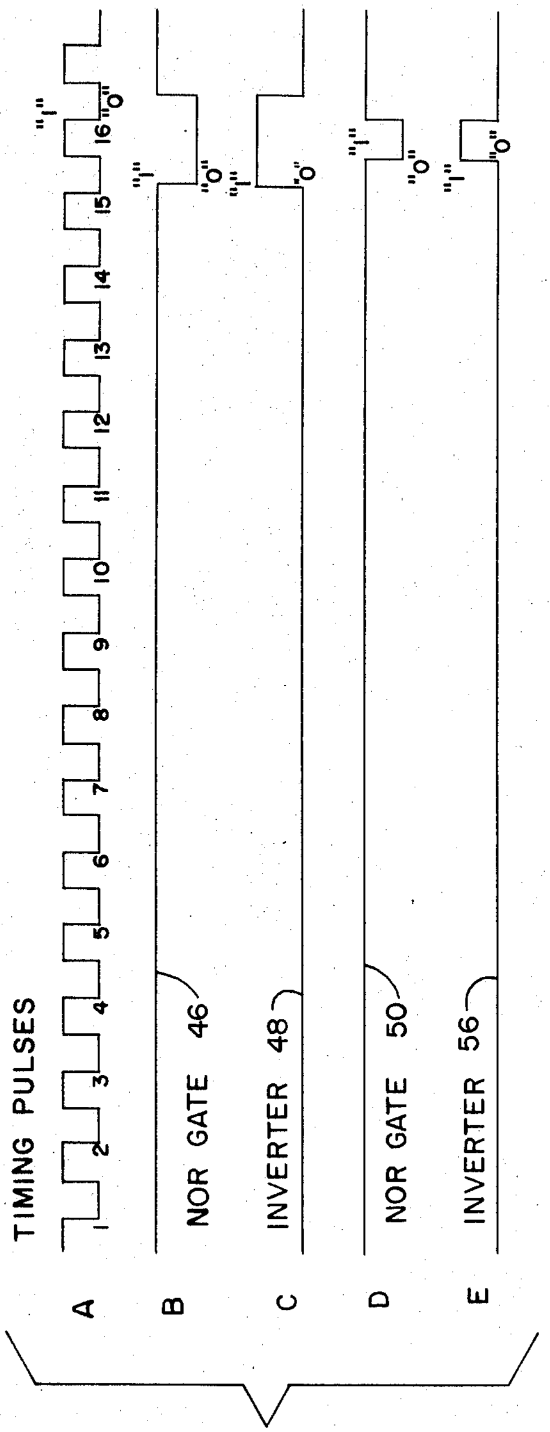
FIG. 5 illustrates the waveforms produced in the operation of the circuit means of FIG. 2.

The digital to analog converter of the present invention includes means connected to the first group of binary counting stages for applying timing pulses to the first group to operate that group in its predetermined counting sequence. As embodied, a source 40 (FIG. 1) of timing pulses is connected to input 22 of the first group of binary counting stages by a conductor 42. The timing pulses produced by source 40 are illustrated in the waveform of FIG. 5A.

In accordance with the invention, the digital to analog converter includes circuit means responsive to the first group of binary counting stages and to the timing pulses for connecting the first and second groups of binary counting stages in series and for producing output pulses synchronized with the timing pulses to operate the second group in its predetermined counting sequence. In a preferred embodiment, the circuit means comprises a gating circuit responsive to the timing pulses and to the first group of binary counting stages for producing an output pulse in synchronism with a timing pulse when a predetermined set of counting states appear in the first group of binary counting stages. As embodied and shown in FIG. 1, the digital to analog converter includes a gating circuit 44 having in input terminal connected to source 40, a plurality of input terminals connected to the binary counting stages of first group 20, and an output terminal connected to input terminal 32 of second group 30 of binary counting stages by a conductor 45.

Figure 2:
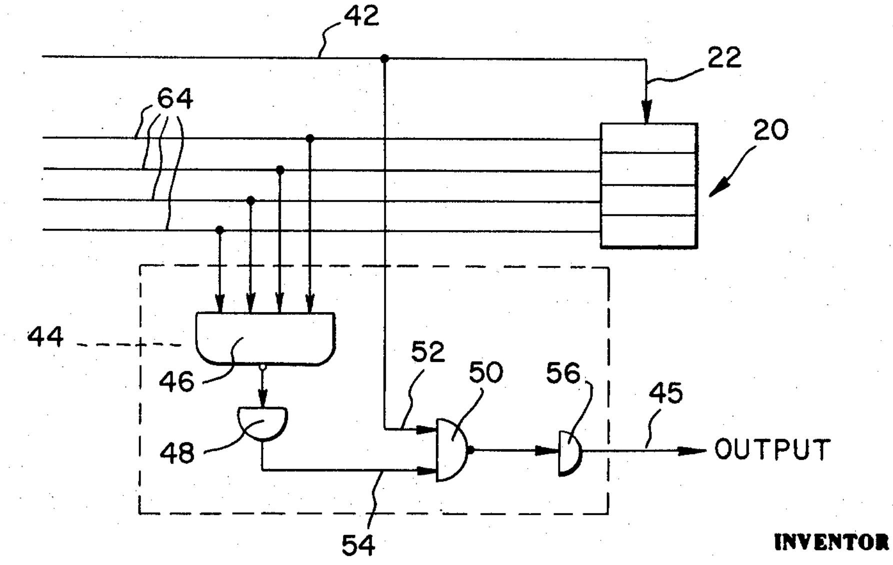
FIG. 2 illustrates the components of the circuit means of FIG. 1 for connecting the groups of binary counting stages in series.

Referring to FIG. 2, the components of the gating circuit of a preferred embodiment are shown in detail. The gating circuit includes a first logic or NAND gate 46 having a plurality of input terminals connected to the first group 20 of binary counting stages. NAND gate 46 has an output terminal connected to an inverter 48. The NAND gate normally produces a binary "1" output signal, and it only produces a binary "0" signal when binary "1" signals are applied to all of its input terminals.

Gating circuit 44 (FIG. 2) also includes a second logic or NAND gate 50 having a first input terminal 52 connected to conductor 42 and responsive to the timing pulses produced by source 40, and a second input terminal 54 responsive to the output terminal of first NAND gate 46 for producing output pulses synchronized with the timing pulses. As shown in FIG. 2, input terminal 54 of NAND gate 50 is connected to the output terminal of inverter 48. NAND gate 50 normally produces a binary "1" output signal and only produces a binary "0" signal when binary "1" signals are applied to both input terminals. An inverter 56 is connected to the output terminal of NAND gate 50. The output terminal of inverter 56 is connected to input 32 of the second group of binary counting stages by conductor 45.

In the operation of gating circuit 44 (FIG. 2), NAND gate 46 normally produces a binary "1" output signal, and a binary "0" signal appears at the output terminal of inverter 48. This binary "0" signal is applied to input terminal 54 of NAND gate 50. With a binary "0" signal on input terminal 54, NAND gate 50 is not affected by the binary "1" to "0" voltage transitions of the timing pulses applied to input terminal 52. Thus, since a binary "1" signal normally appears at the output of NAND gate 50, inverter 56 normally produces a binary "0" signal which has no effect on the second group of binary counting stages. The complete operation of gating circuit 44 is explained below.

In accordance with the invention, the digital to analog converter includes comparator means for comparing the set of binary input signals to the binary counting states of the first and second groups of binary counting stages and for producing an output signal when the binary counting states are identical to the set of binary input signals. As embodied and shown in FIG. 1, a preferred embodiment of the digital to analog converter includes a comparator circuit 60. The comparator circuit is provided with a first set of inputs 62 for receiving the set of binary input signals and a second set of inputs 64 connected to the binary counting stages of first and second groups 20 and 30 of the binary counter.

In addition, comparator circuit 60 is provided with an input 66 connected by conductor 42 to source 40 of the timing pulses. Input 66 is connected to gating circuitry (not shown) in comparator circuit 60 to synchronize its operation with the timing pulses produced by source 40. This gating circuitry is described in detail with respect to the preferred embodiment of FIG. 4.

Comparator circuit 60 also includes an output connected to a conductor 68. In operation, comparator circuit 60 produces an output pulse which is applied to conductor 68 when the binary signals applied to the comparator circuit on inputs 64 from the first and second groups of binary counting stages are identical to the set of binary input signals applied to inputs 62 of the comparator circuit.

The digital to analog converter of this invention also includes an output circuit responsive to the signal produced by the comparator means for producing an analog output signal having an amplitude determined by the time required for the first and second groups of binary counting stages to count from a predetermined set of binary counting states to the binary counting states that are identical to the set of binary input signals. In a preferred embodiment, the output circuit includes a bistable circuit element having a first input terminal responsive to the second group of binary counting stages for driving the bistable circuit element to a first conducting state at the predetermined set of counting states and a second input terminal responsive to the signal produced by the comparator means for driving said bistable circuit element to a second conducting state when the binary counting states of the first and second groups of binary counting stages are identical to the set of binary input signals. Referring to FIG. 1, the digital to analog converter includes an output circuit 70 having an input terminal connected to the output of comparator circuit 60 by conductor 68.

Figure 3:
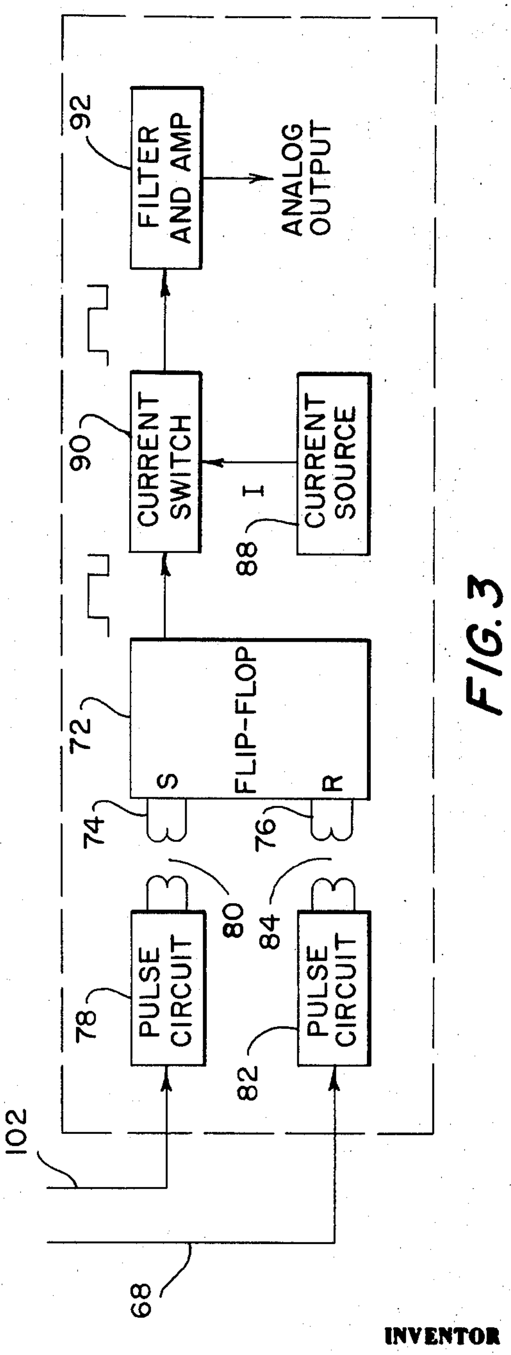
FIG. 3 is a block diagram illustrating the components of the output circuit of FIG. 1 in detail.

The components of the output circuit 70 are shown in detail in FIG. 3. As embodied, the output circuit includes a bistable circuit element or flip-flop 72 having a first input (set) terminal 74 for driving the flip-flop to a first conducting state and a second input (reset) terminal 76 for driving the flip-flop to a second conducting state. First input terminal 74 is connected to the output of a pulse forming circuit 78 by a first pulse transformer 80. Second input terminal 76 is connected to the output of a pulse forming circuit 82 by a second pulse transformer 84. The purpose of pulse transformers 80 and 84 is to isolate digital circuit voltages generated in comparator circuit 60 and binary counter 10 from the analog voltages generated in output circuit 70.

As shown in FIG. 3, output circuit 70 includes a current source 88 which produces a reference current for operating a current switch 90 connected to the current source. Current switch 90 is turned on and turned off by the output signal of flip-flop 72.

In the preferred embodiment, current switch 90 is a transistor which is operated by flip-flop 72 as a current mode switch. In operation, the transistor is not allowed to be driven to saturation by current source 88 when it is turned on by flip-flop 72. Thus, the turn-on and turn-off times of current switch 90 are approximately equal so that the signal applied to the current switch by flip-flop 72 is accurately converted into a pulse having a magnitude determined by current source 88 and a duration determined by the time that flip-flop 72 is in its first operating state.

Output circuit 70 (FIG. 3) also includes a filtering and amplifying circuit 92 connected to the output of current switch 90. The filtering and amplifying circuit eliminates undesirable frequencies from the output signal of current switch 90 and produces an analog output signal having an amplitude proportional to the duration of the output signal of the current switch.

A preferred embodiment of the digital to analog converter includes circuit means responsive to the second group of binary counting stages and having an output coupled to the first input terminal of the bistable circuit element for producing output pulses synchronized with the timing pulses to drive the bistable circuit element to its first conducting state. As embodied and shown in FIG. 1, this circuit means comprises a second gating circuit 100 having a first input terminal connected to the output of first gating circuit 44 by conductor 45 and a plurality of input terminals connected to the second group of binary counting stages. Gating circuit 100 is provided with an output terminal connected by a conductor 102 to another input terminal of output circuit 70. In operation, gating circuit 100 produces an output pulse in synchronism with a timing pulse when a predetermined set of counting states appear in the first and second groups of binary counting stages. The components of gating circuit 100 are identical to the components of gating circuit 44 and are shown in FIG. 2.

Referring to FIG. 3, conductor 102 connects the output terminal of gating circuit 100 to an input terminal of pulse forming circuit 78. When gating circuit 100 produces an output pulse, pulse forming circuit 78 is operated to apply a pulse to pulse transformer 80 and input terminal 74 of flip-flop 72. The pulse applied to input terminal 74 drives flip-flop 72 to its first conducting state and current switch 90 is turned on. The current switch remains turned on until comparator circuit 60 produces an output signal on conductor 68. This output signal is applied to pulse forming circuit 82 to apply a pulse to pulse transformer 84 and input terminal 76 of flip-flop 72. The pulse applied to input terminal 76 drives the flip-flop to its second conducting state and current switch 90 is turned off.

In the operation of the digital to analog converter of FIG. 1, source 40 continuously produces a series of timing pulses in the form of a squarewave signal (FIG. 5A) having a fixed frequency. The timing pulses are applied to input terminal 22 of first group 20 of binary counting stages, and the binary "1" to "0" voltage transitions of the timing pulses operate the first group in its predetermined counting sequence, i.e., 0000, 1000, 0100, 1100, . . . . , 1111.

Assuming that first group 20 of binary counting stages begins its operation at the counting states 1111, the fifteenth binary "1" to "0" voltage transition in the timing pulses causes the counting states of the first group to change from 0111 to 1111 and gating circuit 44 is primed for operation by the next timing pulse. Referring to FIG. 2, the output signal produced by NAND gate 46 changes from a binary "1" to a binary "0." This change in the output signal of NAND gate 46 causes inverter 48 to produce a binary "1" signal which is applied to input terminal 54 of NAND gate 50.

The operation of NAND gate 46 and inverter 48 is illustrated by the waveforms of FIGS. 5B and 5C, respectively. As shown in FIG. 5B, the output signal of NAND gate 46 is not changed from a binary "1" to a binary "0" simultaneously with the fifteenth binary "1" to "0" voltage transition of the timing pulses. The time delay between the fifteenth binary "1" to "0" voltage transition and the change in the output signal of NAND gate 46 is equal to the time delay of the first binary counting stage of first group 20 of binary counting stages. Referring to FIG. 5C, the change in the output signal of NAND gate 46 causes the output signal of inverter 48 to change from the binary "0" to a binary "1."

With a binary "1" signal applied to input terminal 54 by inverter 48, the output signal of NAND gate 60 (FIG. 5D) changes from a binary "1" to a binary "0" when the next binary "0" to "1" voltage transition occurs in the timing pulses. As shown in FIG. 5A, this next voltage transition occurs between the fifteenth and sixteenth binary "1" to "0" voltage transitions in the timing pulses. At this time, inverter 56 changes its output signal from a binary "0" to a binary "1" (FIG. 5E).

When the sixteenth binary "1" to "0" voltage transition occurs in the timing pulses, the output signal of NAND gate 50 returns to its normal value, i.e., binary "1." Inverter 56 produces a binary "1" to "0" voltage transition (FIG. 5E) which is applied to conductor 45 to operate the second group of binary counting stages in its predetermined counting sequence. As shown in FIGS. 5A and 5E, the binary "1" to "0" voltage transition produced by inverter 56 occurs in synchronism with the sixteenth binary "1" to "0" voltage transition of the timing pulses.

At the same time, the sixteenth binary "1" to "0" voltage transition of the timing pulses causes first group 20 of binary counting stages do not return to binary counting states 0000. The binary counting stages do not return to binary "0" counting states simultaneously because of the carry propagation delay associated with the series of binary counting stages. This carry propogation delay does not affect the operation of second group 20 of binary counting stages, however, because the output pulse of gating circuit 44 occurs in synchronism with the sixteenth binary "1" to "0" voltage transition of the timing pulses to operate second group 30. Thus, gating circuit 44 acts as a "carry logic" circuit to eliminate the effect of carry propagation delay in the first group of binary counting stages from the operation of the second group of binary counting stages. The gating circuit limits the carry propogation delay in the operation of binary counter 10 to the delay associated with one group of binary counting stages.

After the sixteenth binary "1" to "0" voltage transition in the timing pulses, first group 20 of binary counting stages is returned to its initial counting states, i.e., 0000, and the operation previously described is repeated. Thus, gating circuit 44 produces only one output signal, i.e., a binary "1" to "0" voltage transition, for every sixteen binary "1" to "0" voltage transitions applied to input terminal 22 of the first group of binary counting stages. As explained above, the binary "1" to "0" voltage transition produced by gating circuit 44 occurs in synchronism with the sixteenth binary "1" to "0" voltage transition in the timing pulses.

The operation of second group 30 of binary counting stages and gating circuit 100 is similar to the operation of first group 20 of binary counting stages and gating circuit 44 described above. The only difference is that the frequency of the binary "1" to "0" transitions applied to input terminal 32 of second group 30 is 1/16 of the frequency of the binary "1" to "0" transitions applied to input terminal 22 of the first group of binary counting stages. Thus, when the binary counting stages of second group 30 arrive at the counting states 1111, gating circuit 100 is primed for operation by the next output pulse produced by gating circuit 44. Referring to FIG. 5E, the binary "0" to "1" transition of the output pulse of gating circuit 44 causes gating circuit 100 to produce a binary "0" to "1" transition at its output. Then the binary "1" to "0" transition of the output pulse of gating circuit 44 results in a binary "1" to "0" transition at the output of gating circuit 100. The binary "1" to "0" transition of the output of gating circuit 100 occurs in synchronism with the transition at the output of gating circuit 44.

The binary "1" to "0" voltage transition produced by gating circuit 100 is applied by conductor 102 to pulse circuit 78 (FIG. 3) to produce an output pulse. This output pulse is applied to pulse transformer 80 and first input terminal 74 of flip-flop 72 to drive the flip-flop to its first conducting state. With flip-flop 72 in its first conducting state, current switch 90 is turned on and the switch produces an output current having a reference value determined by current source 88.

When the binary counting states of second group 30 of binary counting stages change from 1111 to 0000, the binary counting stages of the second group do not return to binary "0" counting states simultaneously. As previously explained, there is a carry propagation delay associated with the series of binary counting stages so that the first counting stage of second group 30 changes its counting state before the last counting stage of the second group. The cumulative time delay of the second group of binary counting stages does not affect the operation of gating circuit 100 because that gating circuit is operated in synchronism with a binary "1" to "0" voltage transition produced by gating circuit 44. Thus, gating circuit 100 eliminates the carry propagation delay of the second group of binary counting stages from the operation of the digital to analog converter.

After flip-flop 72 (FIG. 3) is driven to its first conducting state by the binary "1" to "0" voltage transition produced by gating circuit 100, the flip-flop remains in its first conducting state until a pulse is applied to input terminal 76 of the flip-flop. During the time that flip-flop 72 is in its first conducting state, current switch 90 remains turned on and the reference current appears at its output.

Comparator circuit 60 compares a set of binary input signals applied to inputs 62 to the binary signals (binary counting states) applied to input lines 64 from the binary counting stages of first and second groups 20 and 30. The comparator circuit produces an output pulse when the binary counter arrives at a set of counting states that are identical to the set of binary input signals. Thus, the time period between the appearance of a first input pulse on conductor 102 to output circuit 70 and the appearance of a second input pulse on conductor 68 to the output circuit is determined by the set of binary input signals applied to comparator circuit 60 on inputs 62.

When comparator circuit 60 produces an output signal on conductor 68, this signal causes pulse forming circuit 82 to produce an output pulse. The output pulse is applied to pulse transformer 84 and to input terminal 76 of flip-flop 72 to drive the flip-flop to its second conducting state. With flip-flop 72 in its second conducting state, switch 90 is turned off. At this time, the output current of the current switch is reduced to zero magnitude.

The signal produced by the bistable circuit element, i.e., flip-flop 72, of output circuit 70 is in the form of a pulse having a duration proportional to the time required for the binary counter to count from a predetermined set of binary counting states to the binary counting states that are identical to the set of binary input signals applied to comparator circuit 60. In the digital to analog converter of FIG. 1, the predetermined set of binary counting states consists of the binary counting states 1111 in both groups of binary counting stages. As explained above, gating circuit 100 produces an output signal on conductor 102 to drive flip-flop 72 (FIG. 3) to its first conducting state when the predetermined set of binary counting states appear in the first and second groups of binary counting stages. The flip-flop remains in its first conducting state until comparator circuit 60 produces an output signal on conductor 68 to drive the flip-flop to its second conducting state. The output signal of the comparator circuit occurs when the binary counting states of the first and second groups of binary counting stages are identical to the set of binary input signals.

Since the operation of current switch 90 (FIG. 3) is controlled by the signal produced by flip-flop 72, the current switch produces an output signal in the form of a pulse having a magnitude equal to the reference current and a duration equal to the duration of the pulse produced by the flip-flop. The output pulse produced by current switch 90 is applied to filtering and amplifying circuit 92 which operates as a voltage averaging circuit to produce an analog output signal in the form of a steady voltage having an amplitude determined by the average value of signal produced by the current switch. Thus, the amplitude of the analog output signal is determined by the time required for first and second groups 20 and 30 (FIG. 1) of binary counting stages to count from the predetermined set of binary counting states 1111 to binary counting states identical to the set of binary input signals applied to inputs 62 of comparator circuit 60.

Figure 4:
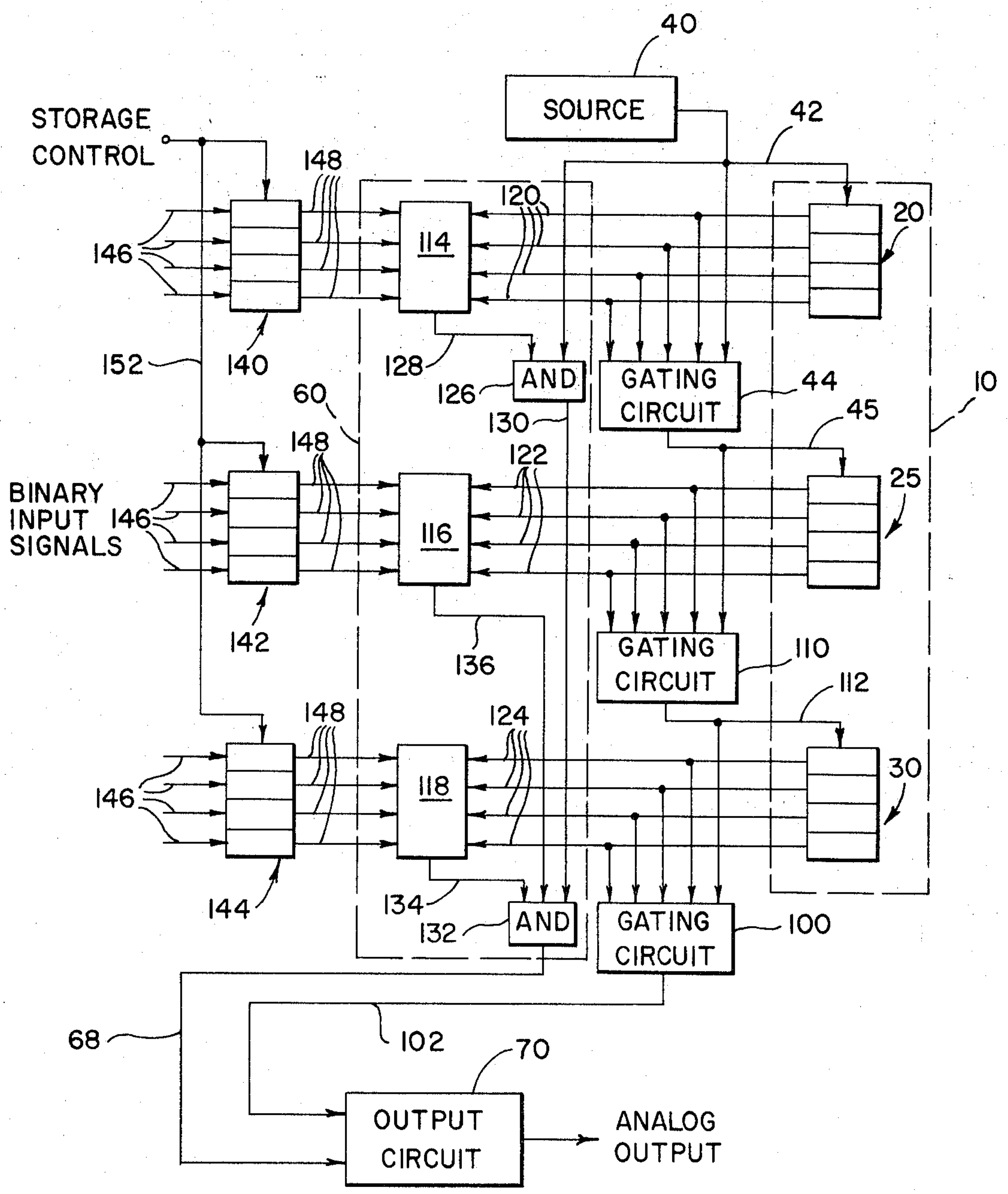
FIG. 4 is a block diagram of a preferred embodiment of the digital to analog converter including a binary counter comprising a plurality of groups of binary counting stages and comparator means comprising a plurality of comparators corresponding to the groups of binary counting stages.

A preferred embodiment of the digital to analog converter of this invention is shown in FIG. 4. The components of the preferred embodiment are similar to the components of the digital to analog converter of FIG. 1. Accordingly, the components of the preferred embodiment which are the same as the components of the digital to analog converter of FIG. 1 are identified by the same reference numerals previously used.

In accordance with the preferred embodiment, the digital to analog converter includes a binary counter comprising a plurality of groups of binary counting stages. Referring to FIG. 4, a binary counter 10 of the preferred embodiment is illustrated as including three groups 20, 25, and 30 of binary counting stages. It is understood, however, that more than three groups can be utilized in the digital to analog converter without departing from the principles of this invention. As described above, each group consists of four bistable counting stages arranged in series and having an input terminal for receiving pulses to operate the group in a predetermined counting sequence.

The digital to analog converter also includes means connected to the input of a first of the groups of binary counting stages for applying timing pulses to the input to operate the first group in its predetermined counting sequence. As shown in FIG. 4, source 40 is connected to the input of first group 20 of binary counting stages by conductor 42.

In the preferred embodiment, the digital to analog converter is provided with a plurality of gating circuits connected to the inputs of the other groups of binary counting stages and responsive to the timing pulses for connecting the groups of binary counting stages in series and synchronizing the groups with the timing pulses. As shown in FIG. 4, the digital to analog converter includes gating circuits 44 and 110. The components of gating circuit 44 are shown in detail in FIG. 2, and gating circuit 110 contains identical components.

Gating circuit 44 has a plurality of input terminals connected to the binary counting stages of first group 20 and an input terminal connected to source 40 for receiving timing pulses. The output of gating circuit 44 is connected to the input of group 25 of binary counting stages by conductor 45. Similarly, gating circuit 110 includes a plurality of input terminals connected to the binary counting stages of group 25 and an input terminal connected to the output terminal of gating circuit 44. Gating circuit 110 has an output terminal connected by conductor 112 to the input of group 30 of binary counting stages.

In the preferred embodiment, comparator means are provided for comparing the set of binary input signals to the binary counting states of the groups of binary counting stages and for producing an output signal when the binary counting states are identical to the set of binary input signals. Referring to FIG. 4, comparator circuit 60 of the digital to analog converter includes a plurality of comparators 114, 116, and 118 corresponding to groups 20, 25, and 30, respectively, of binary counting stages for comparing selected groups of the binary input signals to the binary counting states of the corresponding groups of binary counting stages.

Comparator 114 (FIG. 4) is connected to the binary counting stages of first group 20 by a plurality of conductors 120. Similarly, comparator 116 is connected to the binary counting stages of second group 25 by a plurality of conductors 122, and comparator 118 is connected by a plurality of conductors 124 to the binary counting stages of third group 30.

The comparator means of the preferred embodiment includes gating circuitry having a plurality of input terminals connected to the comparators, an input terminal responsive to the timing pulses and an output terminal for producing an output signal synchronized with one of the timing pulses when the binary counting states of the groups of binary counting stages are identical to the set of binary input signals. As shown in FIG. 4, comparator circuit 60 is provided with gating circuitry including a first AND gate 126 having a first input terminal connected to the output of comparator 114 by a conductor 128 and a second input terminal connected to source 40 by conductor 42. AND gate 126 has an output terminal connected to a conductor 130.

The gating circuitry of comparator circuit 60 also includes a second AND gate 132 having a first input terminal connected by a conductor 134 to the output of comparator 118, a second input terminal connected by a conductor 136 to the output of comparator 116, and a third input terminal connected to the output of AND gate 126 by conductor 130. The output terminal of gate 132 is connected to conductor 68.

The preferred embodiment of the digital to analog converter includes an output circuit responsive to the signal produced by the comparator means for producing an analog output signal having an amplitude determined by the time required for the groups of binary counting stages to count from a predetermined set of binary counting states to the binary counting states that are identical to the set of binary input signals. Referring to FIG. 4, output circuit 70 has an input terminal connected by conductor 68 to the output of comparator circuit 60. In addition, the output circuit has another input terminal connected by a conductor 102 to the output terminal of gating circuit 100.

The components of output circuit 70 are shown in detail in FIG. 3. As described above, the output circuit includes bistable circuit element or flip-flop 72 with first and second input terminals 74 and 76, respectively. The first input terminal is connected to a corresponding pulse forming circuit 78 by a first pulse transformer 80. Similarly, the second input terminal is connected to a corresponding pulse forming circuit 82 by a second pulse transformer 84. The purpose of the pulse transformers is to isolate digital circuit voltages in the comparator circuit and binary counter from analog circuit voltages produced in output circuit 70.

The preferred embodiment also includes a plurality of binary storage elements connected to the comparator means for receiving the set of binary input signals and for applying the binary input signals to the comparator means. As shown in FIG. 4, three groups 140, 142, and 144 of binary storage elements are provided. The groups of binary storage elements include a plurality of input lines 146 for receiving binary input signals applied to the digital to analog converter, and a plurality of output lines 148 connected to the corresponding comparators of comparator circuit 60. First group 140 of binary storage elements is connected to comparator 114. Second group 142 of binary storage elements is connected to comparator 116, and third group 144 of binary storage elements is connected to comparator 118.

A storage control conductor 152 is connected to an input terminal for each group of binary storage elements. When a storage control signal is applied to the groups of binary storage elements on conductor 152 the binary storage elements are enabled to receive and store the set of binary input signals applied to the digital to analog converter on input lines 146.

The operation of the digital to analog converter of the preferred embodiment (FIG. 3) is substantially the same as the operation of the digital to analog converter of FIG. 1. Source 40 continuously produces a series of timing pulses in the form of a squarewave signal (FIG. 5A) having a fixed frequency to operate binary counter 10.

The timing pulses are applied to the input terminal of first group 20 of binary counting stages to operate the first group in this predetermined counting sequence. The second group of binary counting stages is operated in its predetermined counting sequence by output pulses produced by gating circuit 44, and the third group of binary counting stages is operated in its predetermined counting sequence by output pulses produced by gating circuit 110.

Gating circuit 44 acts as a "carry logic" circuit to eliminate the effect of carry propagation delay in first group 20 of binary counting stages from the operation of second group 25 of binary counting stages. Similarly, gating circuit 110 acts as a "carry logic" circuit to eliminate the effect of the carry propagation delay in the second group from the operation of third group 30 of binary counting stages. Thus, gating circuits 44 and 110 limit the carry propagation delay in the operation of binary counter 10 to the delay associated with one group of binary counting stages.

Gating circuit 100 is responsive to the binary counting stages of third group 30 and the output signal of gating circuit 110 and produces an output signal on conductor 102 when a predetermined set of binary counting states appear in the three groups of binary counting stages. In the preferred embodiment, the predetermined counting states consist of the counting states 1111 in the three groups of binary counting stages.

When the predetermined set of binary counting states appears in the groups of binary counting stages, the signal applied to conductor 102 drives flip-flop 72 of the output circuit to its first conducting state. Current switch 90 is turned on and produces an output signal having a magnitude equal to the reference current produced by current source 88.

Flip-flop 72 remains in its first conducting state and current switch 90 remains turned on until the groups of binary counting stages arrive at a set of binary counting states which is identical to the set of binary input signals applied on input lines 146 to the digital to analog converter. Comparator circuit 60 produces an output signal in synchronism with a timing pulse on conductor 68 which drives flip-flop 72 to its second conducting state. Current switch 90 is turned off and its output signal decreases to zero magnitude. Thus the current switch produces an output signal in the form of a pulse having a magnitude equal to the reference current and a duration determined by the time that flip-flop 72 is in its first conducting state.

The output pulse produced by current switch 90 (FIG. 3) is applied to filtering and amplifying circuit 92 which operates as a voltage averaging circuit to produce an analog output signal in the form of a steady voltage having an amplitude determined by the average value of the signal produced by the current switch. Thus, the amplitude of the analog output signal is determined by the time required for the three groups of binary counting stages of binary counter 10 (FIG. 4) to count from the predetermined set of binary counting states 1 1 1 1 to the binary counting states that are identical to the set of binary input signals applied to input lines 146 of comparator circuit 60.

The digital to analog converter of this invention is capable of operation at increased frequencies because of the use of gating circuits in its binary counter to reduce the carry propagation delay in the operation of the digital to analog converter. As explained in the description of the preferred embodiments, the gating circuits serve as carry logic circuits to limit the carry propagation delay to the delay of one group of binary counting stages in the binary counter.

The invention in its broader aspects is not limited to the specific details shown and described, and modifications may be made in the details of the digital to analog converter without departing from the principles of the present invention.

What is claimed is:

1. A digital to analog converter for converting a set of binary input signals into an analog output signal, which comprises:

a binary counter comprising first and second groups of binary counting stages, each group of binary counting stages being operable in a predetermined counting sequence;

means connected to said first group of binary counting stages for applying timing pulses thereto to operate said first group in its predetermined counting sequence;

circuit means responsive to each of said first group of binary counting stages and to said timing pulses for connecting said first and second groups of binary counting stages in series and for producing output pulses synchronized with said timing pulses to operate said second group in its predetermined counting sequence;

comparator means for comparing the set of binary input signals to the binary counting states of said first and second groups of binary counting stages and for producing an output signal when the binary counting states are identical to the set of binary input signals; and an output circuit responsive to the signal produced by said comparator means for producing an analog output signal having an amplitude determined by the time required for said first and second groups of binary counting stages to count from a predetermined set of binary counting states to the binary counting states that are identical to the set of binary input signals.

2. The digital to analog converter of claim 1, wherein said circuit means comprises:

a gating circuit responsive to said timing pulses and to each of said first group of binary counting stages for producing an output pulse in synchronism with a timing pulse when a predetermined set of counting states appear in said first group of binary counting stages.

3. The digital to analog converter of claim 2, wherein said gating circuit comprises:

a first logic gate having a plurality of input terminals connected to said first group of binary counting stages and an output terminal; and a second logic gate having a first input terminal responsive to said timing pulses and a second input terminal connected to said output terminal of said first logic gate for producing output pulses synchronized with said timing pulses.

4. The digital to analog converter of claim 1, wherein said output circuit includes:

a bistable circuit element having a first input terminal responsive to said second group of binary counting stages for driving said bistable circuit element to a first conducting state at the predetermined set of binary counting states and a second input terminal responsive to the signal produced by said comparator means for driving said bistable circuit element to a second conducting state when the binary counting states of said first and second groups of binary counting stages are identical to the set of binary input signals.

5. The digital to analog converter of claim 4, which includes:

circuit means responsive to each of said second group of binary counting stages and having an output coupled to said first input terminal of said bistable circuit element for producing output pulses synchronized with said timing pulses to drive said bistable circuit element to its first conducting state.

6. The digital to analog converter of claim 5, wherein:

said circuit means responsive to said first group of binary counting stages comprises a first gating circuit having a first input terminal responsive to said timing pulses and a plurality of input terminals connected to said first group of binary counting stages for producing an output pulse in synchronism with a timing pulse when a predetermined set of counting states appear in said first group of binary counting stages; and said circuit means responsive to said second group of binary counting stages comprises a second gating circuit having a first input terminal connected to the output of said first gating circuit and a plurality of input terminals connected to said second group of binary counting stages for producing an output pulse in synchronism with a timing pulse when a predetermined set of counting states appear in said first and second groups of binary counting stages.

7. The digital to analog converter of claim 6, which includes:

a first pulse transformer for connecting the output of said second gating circuit to said first input terminal of said bistable circuit element; and a second pulse transformer for connecting the output of said comparator to said second input terminal of said bistable circuit element.

8. A digital to analog converter for converting a set of binary input signals into an analog output signal, which comprises:

a binary counter comprising a plurality of groups of binary counting stages, each group of binary counting stages having an input for receiving pulses to operate said group in a predetermined counting sequence;

means connected to the input of a first of said groups of binary counting stages for applying timing pulses to said input to operate said first group in its predetermined counting sequence;

a plurality of gating circuits connected to the inputs of the other groups of binary counting stages and responsive to said timing pulses for connecting said groups of binary counting stages in series and synchronizing said groups with said timing pulses, one of said gating circuits including a plurality of inputs responsive to each of the binary counting stages of said first group of binary counting stages and an input responsive to the timing pulses, and each of the remaining gating circuits including a plurality of inputs responsive to each of binary counting stages of a corresponding group of binary counting stages and an input responsive to the preceding gating circuit;

comparator means for comparing the set of binary input signals to the binary counting states of said groups of binary counting stages and for producing an output signal when the binary counting states are identical to the set of binary input signals; and an output circuit responsive to the signal produced by said comparator means for producing an analog output signal having an amplitude determined by the time required for said groups of binary counting stages to count from a predetermined set of binary counting states to the binary counting states that are identic to the set of binary input signals.

9. The digital to analog converter of claim 8, wherein said comparator means comprises:

a plurality of comparators corresponding to said groups of binary counting stages and responsive to selected groups of the binary input signals for comparing the selected groups of binary input signals to the binary counting states of the corresponding groups of binary counting stages, each comparator producing an output signal when the binary counting states of the corresponding groups of binary counting stages are identical to the selected group of binary input signals applied to said comparator; and gating circuitry having a plurality of input terminals connected to said comparators, an input terminal responsive to said timing pulses, and an output terminal for producing an output signal synchronized with one of said timing pulses when the binary counting states of said groups of binary counting stages are identical to the set of binary input signals.

10. A digital to analog converter for converting a set of binary input signals into an analog output signal, which comprises:

a binary counter comprising a plurality of groups of binary counting stages, each group of binary counting stages having an input for receiving pulses to operate said group in a predetermined counting sequence;

means connected to the input of a first of said groups of binary counting stages for applying counting pulses to said input to operate said first group in its predetermined counting sequence;

a plurality of gating circuits connected to the inputs of the other groups of binary counting stages and responsive to said timing pulses for connecting said groups of binary counting stages in series and synchronizing said groups with said timing pulses:

a plurality of comparators corresponding to said groups of binary counting stages and responsive to selected groups of the binary input signals for comparing the selected groups of binary input signals to the binary counting states of the corresponding groups of binary counting stages, each comparator producing an output signal when the binary counting states of the corresponding groups of binary counting stages are identical to the selected group of binary input signals applied to said comparator;

gating circuitry having a plurality of input terminals connected to said comparators, an input terminal responsive to said timing pulses, and an output terminal for producing an output signal synchronized with one of said timing pulses when the binary counting states of said groups of binary counting stages are identical to the set of binary input signals, said gating circuitry comprising a first AND gate having a pair of input terminals responsive to said timing pulses and the output signals of one of said comparators, respectively, and an output terminal;

a second AND gate having a plurality of input terminals responsive to the output signals of the other comparators, an input terminal connected to said output terminal of said first AND gate, and an output terminal for producing an output signal synchronized with one of said timing pulses the binary counting states of said groups of binary counting stages are identical to the set of binary input signals; and an output circuit responsive to the signal produced by said comparator means for producing an analog output signal having an amplitude determined by the time required for said groups of binary counting stages to count from a predetermined set of binary counting states to the binary counting states that are identical to the set of binary input signals.

11. The digital to analog converter of claim 10, wherein each of said gating circuits comprises:

a first logic gate having a plurality of input terminals connected to one of said groups of binary counting stages and an output terminal; and a second logic gate having a first input terminal responsive to said timing pulses, a second input terminal connected to said output terminal of said first logic gate, and an output terminal connected to the input of another of said groups of binary counting stages for producing output pulses synchronized with said timing pulses.

12. The digital to analog converter of claim 8, wherein said output circuit includes:

a bistable circuit element having a first input terminal responsive to said groups of binary counting stages for driving said bistable circuit element to a first conducting state at the predetermined set of binary counting states and a second input terminal responsive to the signal produced by said comparator means for driving said bistable circuit element to a second conducting state when the binary counting states of said groups of binary counting stages are identical to the set of binary input signals.

13. A digital to analog converter for converting a set of binary input signals into an analog output signal, which comprises:

a binary counter comprising a plurality of groups of binary counting stages, each group of binary counting stages having an input for receiving pulses to operate said group in a predetermined counting sequence;

means connected to the input of a first of said groups of binary counting stages for applying timing pulses to said input to operate said first group in its predetermined counting sequence;

a plurality of gating circuits connected to the inputs of the other groups of binary counting stages and responsive to said timing pulses for connecting said groups of binary counting stages in series and synchronizing said groups with said timing pulses;

comparator means for comparing the set of binary input signals to the binary counting states of said groups of binary counting stages and for producing an output signal when the binary counting states are identical to the set of binary input signals;

an output circuit responsive to the signal produced by said comparator means for producing an analog output signal having an amplitude determined by the time required for said groups of binary counting stages to count from a predetermined set of binary counting states to the binary counting states that are identical to the set of binary input signals;

said output circuit comprising a bistable circuit element having a first input terminal responsive to said groups of binary counting stages for driving said bistable circuit element to a first conducting state at the predetermined set of binary counting states and a second input terminal responsive to the signal produced by said comparator means for driving said bistable circuit element to a second conducting state when the binary counting states of said groups of binary counting stages are identical to the set of binary input signals; and a gating circuit having a plurality of input terminals connected to the binary counting stages of the last of said groups of binary counting stages, an input terminal responsive to the other groups of binary counting stages, and an output terminal coupled to said first input terminal of said bistable circuit element for producing an output pulse synchronized with one of said timing pulses when the predetermined set of binary counting states appears in said groups of binary counting stages.

14. The digital to analog converter of claim 13, which includes:

a first pulse transformer for connecting said first input terminal of said bistable device to the output of said gating circuit connected to the last of said groups of binary counting stages; and a second pulse transformer for connecting said second input terminal of said bistable device to the output of said comparator.

15. The digital to analog converter of claim 8, which includes:

a plurality of bistable storage elements connected to said comparator means for receiving the set of binary input signals and applying the signals to said comparator means.

16. The digital to analog converter of claim 9, which includes:

a plurality of groups of bistable storage elements connected to said comparators for receiving selected groups of the binary input signals and applying the selected groups of signals to the corresponding comparators.

* * * * *

UNITED STATES PATENT OFFICE
CERTIFICATE OF CORRECTION

Patent No. 3,705,399 Dated December 5, 1972

Inventor(s) William M. Hawkins

It is certified that error appears in the above-identified patent and that said Letters Patent are hereby corrected as shown below:

Column 7, line 52, change "60" to --50--.

Column 8, line 7, change "do not return to binary" to --to return to the binary--.

Claim 8, column 15, line 57, change "identic" to --identical--.

Claim 10, column 16, line 57, after "pulses" insert --when--.

Signed and sealed this 24th day of April 1973.

(SEAL)
Attest:

EDWARD M.FLETCHER,JR.
Attesting Officer

ROBERT GOTTSCHALK
Commissioner of Patents